US008890570B2

(12) United States Patent
Cho et al.

(10) Patent No.: US 8,890,570 B2
(45) Date of Patent: Nov. 18, 2014

(54) SWITCH BLOCK CIRCUIT IN FIELD PROGRAMMABLE GATE ARRAY

(75) Inventors: Han Jin Cho, Daejeon (KR); Young Hwan Bae, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 22 days.

(21) Appl. No.: 13/607,637

(22) Filed: Sep. 7, 2012

(65) Prior Publication Data
US 2013/0147516 A1    Jun. 13, 2013

(30) Foreign Application Priority Data
Dec. 12, 2011 (KR) .................. 10-2011-0133021

(51) Int. Cl.
*H01L 25/00* (2006.01)
*H03K 19/173* (2006.01)
*G11C 5/06* (2006.01)

(52) U.S. Cl.
USPC .................. 326/41; 326/38; 365/63; 327/565

(58) Field of Classification Search
USPC ............... 326/37–41, 47, 101, 115, 119; 327/564–566; 716/100–139
See application file for complete search history.

(56) References Cited

U.S. PATENT DOCUMENTS

| | | | |
|---|---|---|---|
| 6,504,398 B1 * | 1/2003 | Lien et al. ................. | 326/41 |
| 6,828,824 B2 * | 12/2004 | Betz et al. ................. | 326/47 |
| 7,193,437 B2 * | 3/2007 | Cappelli et al. ............ | 326/41 |
| 7,332,934 B2 * | 2/2008 | Madurawe ................ | 326/38 |
| 7,463,055 B2 * | 12/2008 | Ciccarelli et al. .......... | 326/38 |
| 7,463,067 B2 | 12/2008 | Ciccarelli et al. | |
| 7,629,812 B2 * | 12/2009 | Thummalapally et al. .. | 326/38 |
| 8,183,881 B1 * | 5/2012 | Stassart et al. ............. | 326/38 |
| 8,193,830 B2 * | 6/2012 | Schmit et al. ............. | 326/38 |
| 2002/0113619 A1 * | 8/2002 | Wong ....................... | 326/41 |

FOREIGN PATENT DOCUMENTS

WO    WO 02/13389 A2    2/2002

* cited by examiner

*Primary Examiner* — Dylan White

(57) ABSTRACT

A switch block circuit in a field programmable gate array is provided. The switch block circuit includes a configuration memory unit including first group memories and second group memories and a switching unit including first group switching transistors and second group switching transistors. The switch block circuit further includes a selection unit for correspondingly connecting the second group memories with the second group switching transistors depending on an operation mode. The switch block is efficiently reconfigurable depending on the intended use, and configuration memories unused in a specific operation mode may be applied to other purposes.

18 Claims, 5 Drawing Sheets

SWITCH BLOCK CIRCUIT IN FIELD PROGRAMMABLE GATE ARRAY

CROSS-REFERENCE TO RELATED APPLICATIONS

This US non-provisional patent application claims priority under 35 USC §119 to Korean Patent Application No. 10-2011-0133021, filed on Dec. 12, 2011, the entirety of which is hereby incorporated by reference.

BACKGROUND OF THE INVENTION

The present general inventive concept relates to gate arrays and, more particularly, to a switch block circuit in a field programmable gate array.

In general, a field programmable gate array (hereinafter referred to as "FPGA") is a chip which allows a user to implement desired integrated circuits using several hundreds of switches.

A switch block is a set of switches and may be divided into blocks that are capable of connecting input, output, and routing tracks.

A switch is functionally a static random access memory (SRAM), but has the form of a latch or flip-flop in practical circuit implementation because it should be accessed by each single bit. For this reason, the switch requires a larger silicon area than a conventional memory such as an SRAM or DRAM.

In the design of an FPGA, it is the most significant to maximize a gate that a user can use. This is accomplished by minimizing an occupied silicon area while increasing programmability.

One of methods for decreasing the number of switches is to optimize a switch block according to the kind of an integrated circuit implemented in an FPGA. That is, all possible pattern connections can be made available in a control-oriented circuit, and a bit-slice pattern connection can be made available in a data-pass-oriented circuit. The optimization of the switch block makes it possible to implement a switch block including a much smaller number of switches.

Nonetheless, it is difficult to apply a switch block for use in a data-pass-oriented circuit to the cases except for a data pass circuit. In the case that a switch block for use in data-pass-oriented circuit is used in a control-oriented circuit, additional tracks are assigned to a control-oriented switch block. Since the additional tracks are required, use efficiency of the switch block is reduced.

SUMMARY OF THE INVENTION

Embodiments of the inventive concept provide a switch block circuit in a field programmable gate array.

According to an aspect of the inventive concept, the switch block circuit may include a configuration memory unit including first group memories and second group memories; a switching unit including first group switching transistors respectively switched depending values stored in the first group memories and second group switching transistors respectively switched depending on values stored in the second group memories; and a selection unit configured to correspondingly connect the second group memories with the second group switching transistors according to an operation mode.

In an exemplary embodiment, the selection unit may include second group multiplexers responding to a selection control signal differentially applied according to the operation mode.

In an exemplary embodiment, the operation mode may include a control-oriented operation mode and a data-pass-oriented operation mode.

In an exemplary embodiment, the second group memories and the second group switching transistors may be correspondingly connected through the second group multiplexers in the control-oriented operation mode.

In an exemplary embodiment, the second group memories and the second group switching transistors may be separated by the second group multiplexers in the data-pass-oriented operation mode.

In an exemplary embodiment, the selection control signal may be provided from a program memory.

In an exemplary embodiment, the switch block circuit may further include first group multiplexers configured to correspondingly connect the first group memories with the first group switching transistors according to a common control determination signal.

In an exemplary embodiment, a first memory in the first group memories and a first switching transistor in the first group switching transistors may be directly connected without interposition of the first group multiplexers.

In an exemplary embodiment, the common control determination signal may be provided from a program memory.

In an exemplary embodiment, the second group memories unused in the data-pass-oriented operation mode may be used as a routing buffer with a first-in-first-out (FIFO) function.

In an exemplary embodiment, the second group memories unused in the data-pass-oriented operation mode may be used as a shift-register-based delay circuit.

In an exemplary embodiment, first input terminals of the first group multiplexers are commonly connected to the first memory and second input terminals thereof are correspondingly connected to the first group memories except for the first memory, respectively.

According to another aspect of the inventive concept, the switch block circuit may include a configuration memory unit including first group memories and second group memories; a switching unit first group switching transistors respectively switched depending on values stored in the first group memories and second group switching transistors respectively switched depending on values stored in the second group memories; second group multiplexers configured to correspondingly connect the second group memories with the second group switching transistors according to a selection control signal; and a program memory configured to commonly apply the selection control signal to the second group multiplexers.

In an exemplary embodiment, the selection control signal may be differentially applied in a control-oriented operation mode and a data-pass-oriented operation mode.

In an exemplary embodiment, the second group multiplexers may correspondingly connect the second group memories with the second group switching transistors in the control-oriented operation mode.

In an exemplary embodiment, the second group multiplexers may make the second group memories and the second group switching transistors unconnected in the data-pass-oriented operation mode.

In an exemplary embodiment, the switch block circuit may further include first group multiplexers configured to correspondingly connect the first group memories with the first group switching transistors according to a common control determination signal.

In an exemplary embodiment, the second group memories unused in the data-pass-oriented operation mode may be used as a lookup table.

In an exemplary embodiment, the second group memories unused in the data-pass-oriented operation mode may be used as a data delay circuit.

BRIEF DESCRIPTION OF THE DRAWINGS

The inventive concept will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the inventive concept.

DETAILED DESCRIPTION

Figure 1:
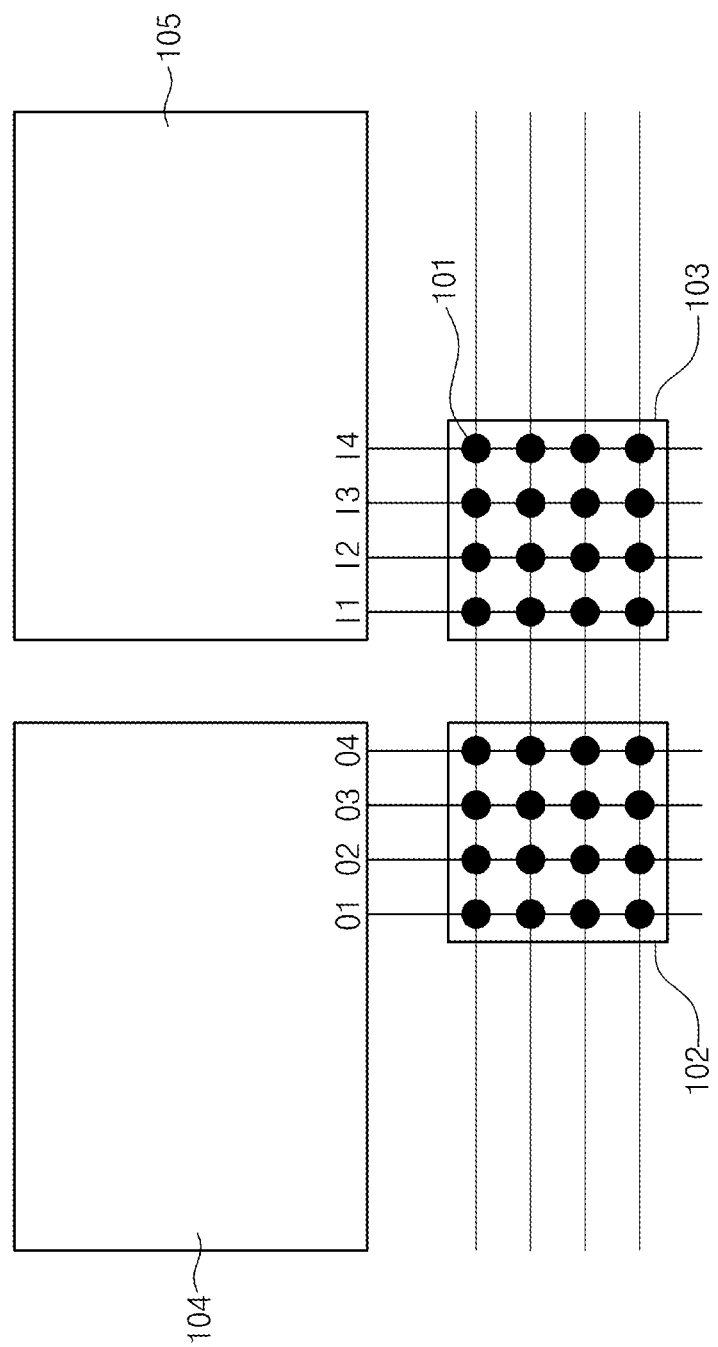
FIG. 1 is a connection configuration diagram of a typical control-oriented switch block.

The objects, advantages, and features of the inventive concept will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose examples of the inventive concept and to let those skilled in the art understand the nature of the inventive concept.

In the specification, it will also be understood that when an element or parts are referred to as being "on" a target element block, it can be directly on the target element block, or intervening another element may also be present.

Throughout the drawings, the same or similar reference numerals designate the same or similar elements. In some drawings, relationships between elements and lines are explained for clarity of the inventive concept and blocks may be further provided on other elements or electronic components.

It is to be noted that embodiments described and exemplified herein should be interpreted to include complementary embodiments thereof. Also it is to be noted that basic explanations with respect to basic shape, manufacturing, and operation of a switch will not be done in detail to prevent ambiguity of the inventive concept.

Figure 3:
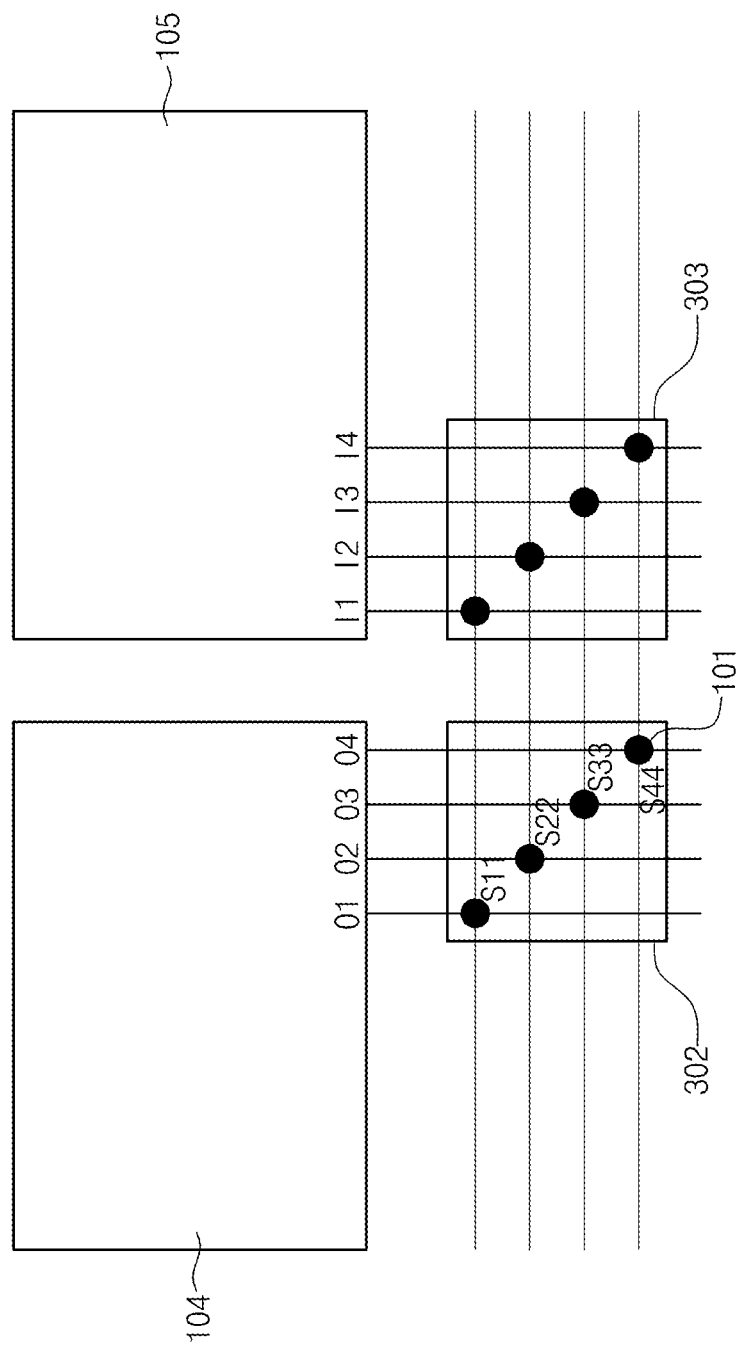
FIG. 3 is a connection configuration diagram of a typical data-pass-oriented switch block.
Figure 4:
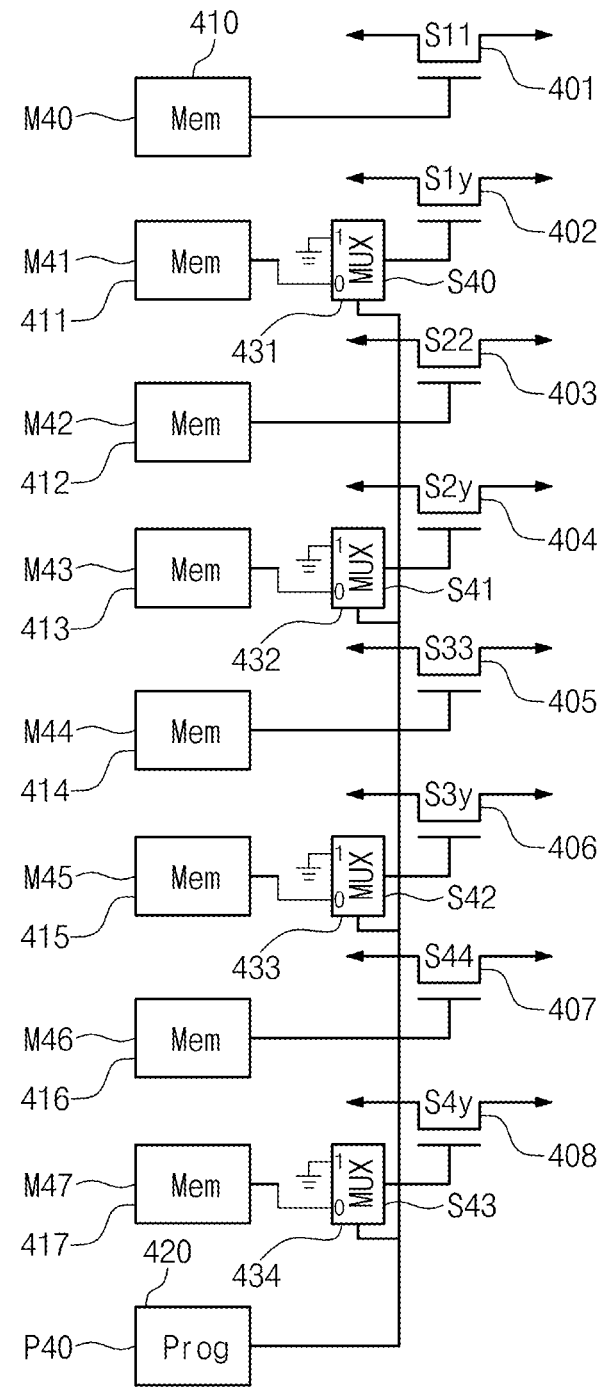
FIG. 4 is a circuit configuration diagram of a configurable switch block according to an embodiment of the inventive concept.

In the following description, a control-oriented switch block and a data-pass-oriented switch block will now be described below with reference to FIGS. 1 to 3 in order to provide a thorough understanding of FIG. 4 illustrating an embodiment of the inventive concept.

Figure 2:
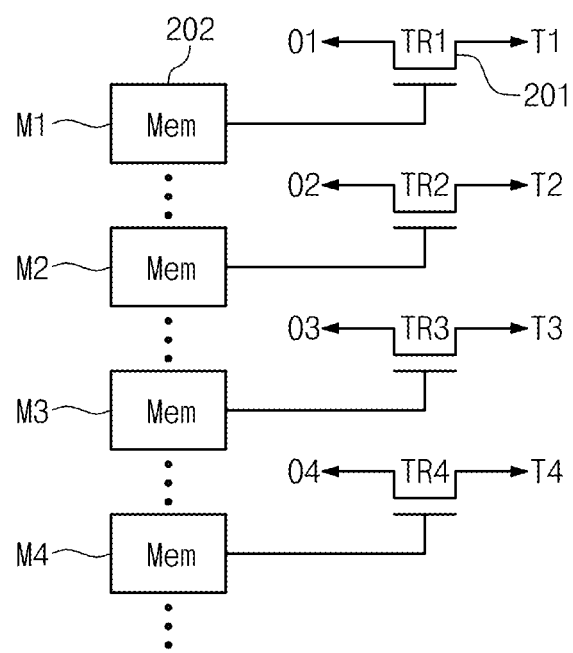
FIG. 2 is a detailed circuit diagram of a switch block in FIG. 1.

FIG. 1 illustrates a connection configuration of a typical control-oriented switch block, and FIG. 2 is a detailed circuit diagram of a switch block in FIG. 1. FIG. 3 illustrates a connection configuration of a typical data-pass-oriented switch block.

Referring to FIG. 1, switch blocks 102 and 103 for use in a control-oriented circuit includes a plurality of switches 101 between all inputs/outputs and tracks.

Signals of output terminals O1-O4 of a logic module 104 are transmitted to tracks through an output switch block 102. The transmitted signals of the output terminals O1-O4 may be applied to input terminals I1-I4 of a logic module 105 through an input switch block 103.

The switch blocks 102 and 103 shown in FIG. 1 allow one output signal to be input to a plurality of input terminals at the same time. That is, the switch blocks 102 and 103 makes it possible to configure a control-oriented circuit.

The number of configuration memories required to configure a set of the switch blocks is 32 in the case of FIG. 1. Generally, in case of p outputs, q inputs, and s tracks, (p+q)*s configuration memories are required.

Referring to FIG. 2 illustrating a detailed circuit of a switch block, a connection relationship between a plurality of switching transistors TR1, TR2, TR3, and TR4 and a plurality of configuration memories M1, M2, M3, and M4 is shown.

Each configuration memory 202 is connected to a gate of each switching transistor 201. The switching transistor 201 is driven according to a value of an output applied from the configuration memory 202. For example, when a high-level output is applied from a first configuration memory 202, the first switching transistor TR1 is driven to connect two terminals O1 and T1 to each other.

In this case, an output value of the configuration memory 202 is determined depending on an externally input bit stream during FPGA programming. When a switch is not used, a stored value for turning off a switch must be programmed into each configuration memory 202.

FIG. 3 illustrates the configuration of a switch block that is mainly used in a data-pass-oriented circuit. In the data-pass-oriented circuit, data communication is performed through a bus. That is, data is transferred at a time not through a one-bit bus but through a 16-bit or 32-bit unit bus. In FIG. 3, for efficient implementation of a bit slice form, all switches are removed except for the switch 101 required for bus connection.

An output O1 of a logic module 104 is connected to an input I1 of another logic module 105 through a corresponding switch, and an output O2 is connected to an input I2 through a corresponding a switch. Likewise, a dedicated connection method of outputs and inputs is determined. The switch block configuration shown in FIG. 3 may dramatically decrease the number of configuration memories.

That is, the number of configuration memories required in FIG. 3 is eight. Accordingly, the number of configuration memories decreases by about 75 percent, as compared to the control-oriented circuit in FIG. 1. In many cases, switches required for bus connection are used at the same time. Therefore, a one-bit configuration memory may control the entirety of switch blocks 302 and 303.

It is difficult to apply the switch blocks 302 and 303 for use in a data-pass-oriented circuit, shown in FIG. 3, in the cases except for a data pass circuit. In the case that a switch block for use in a data-pass-oriented circuit is used in a control-oriented circuit, additional tracks are necessarily assigned to the control-oriented circuit. In this case, the switch block for use in a data-pass-oriented circuit is auxiliarily used in a control-oriented switch block. Thus, it is difficult to construct configurable switch blocks that are compatible and efficiency for use of the switch block is reduced.

In order to address the above issue, embodiments of the inventive concept provide a programmable switch block that is constructed depending on the intended use.

Figure 5:
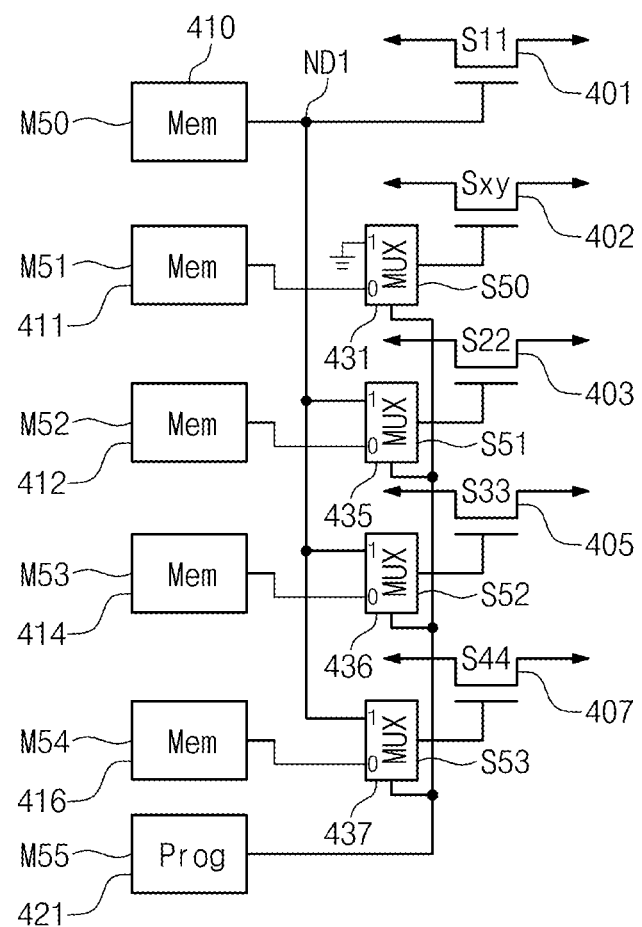
FIG. 5 is a circuit configuration diagram of a configuration switch block according to a modified version of the embodiment illustrated in FIG. 4.

FIG. 4 is a circuit configuration diagram of a configurable switch block according to an embodiment of the inventive concept, and FIG. 5 is a circuit configuration diagram of a configuration switch block according to a modified version of the embodiment illustrated in FIG. 4.

Referring to FIG. 4, a switch block includes a configuration memory unit including a plurality of configuration memories M40-M47, a switching unit including a plurality of switching transistors 401-408, and a plurality of multiplexers (MUX) 431-434.

For the convenience of explanation or depending on the intended use, the configuration memory unit may be divided into first group memories 410, 412, 414, and 416 and second group memories 411, 413, 415, and 417.

Accordingly, the switching unit may be divided into first group switching transistors 401, 403, 405, and 407 respectively switched depending on values stored in the first group memories 410, 412, 414, and 416 and second group switching transistors 402, 404, 406, and 408 respectively switched depending on values stored in the second group memories 411, 413, 415, and 417.

Second group multiplexers indicating the multiplexers 431-434 correspondingly connect the second group memories 411, 413, 415, and 417 with the second group switching transistors 402, 404, 406, and 408 according to a selection control signal.

The program memory 420 commonly applies the selection control signal to the second group multiplexers 431-434.

A switch block circuit in a field programmable gate array, as shown in FIG. 4, has a configurable routing block (CRB) structure.

That is, the CRB is a switch block that is programmable depending on the intended use. That is, a control or data pass switch block is determined depending on a stored value, i.e., the selection control signal of the program memory 420. Thus, the switch block may be efficiently used.

Likewise, it will be understood that the CRB structure in FIG. 4 is a structure in which 2:1 multiplexers are disposed respectively between the second group memories 411, 413, 415, and 417 and the second group switching transistors 402, 404, 406, and 408 and a switching block is reconfigurable through the program memory 420.

When the value of the program memory 420 is logical "0", the selection control signal is LOW and thus the second group memories 411, 413, 415, and 417 and the second group switching transistors 402, 404, 406, and 408 are correspondingly connected to each other. In this case, the operation mode is a typical control-oriented operation mode, as shown in FIG. 1. Accordingly, all the configuration memories M40-M47 in the configuration memory unit are connected to all the switching transistors 401-408 in the switching unit to function as a control-oriented switch block. In this case, there is no idle configuration memory.

However, when the value of the program memory 420 is logical "1", the data-pass-oriented switch block in FIG. 3 is reconfigured. That is, the second group memories 411, 413, 415, and 417 and the second group switching transistors 402, 404, 406, and 408 are operatively separated by a memory unconnecting operation of the second group multiplexers 431-434. As a result, gates of switching transistors 401, 403, 405, and 407 of a switch pattern, i.e., switches S11, S22, S33, and S44 shown in FIG. 3 are connected, with no change, to corresponding configuration memories 410, 412, 414, and 416, respectively. On the other hand, switching transistors 402, 404, 406, and 407 of switches S1y, S2y, S3y, and S4y disposed in positions deviating from the positions of the switches in FIG. 3 are maintained at a switch-off state. Thus, since the second group memories 411, 413, 415, and 417 are idle memories, they may be applied to other uses.

Generally, the switches of the S11 (401), S22 (403), S33 (405), and S44 (407) operate at the same time in case of bus communication.

Accordingly, in this case, these four switches may be commonly controlled through first group multiplexers 431, 435, 436, and 437 connected to the configuration memory 410, as shown in FIG. 5.

FIG. 5 illustrates a configurable routing structure further including first group multiplexers 435, 436, and 437 for correspondingly connecting the first group memories 412, 414, and 416 with the first group switching transistors 403, 405, and 407 according to a common control determination signal of the program memory 421. The first memory 410 in the first group memories and the first switching transistor 401 in the first group switching transistors are directly connected without interposition of the first group multiplexers.

Referring to FIG. 5, similar to the connection structure shown in FIG. 4, Sxy switching transistor 402 (x≠y) is connected to a configuration memory 411 through a multiplexer 431. On the other hand, S22, S33, and S44 switching transistors 403, 405, and 407 are connected to the configuration memories 412, 414, and 416 through 2:1 multiplexers 435, 436, and 437, respectively.

In FIG. 5, two configuration memories (410 and 411) are required in the case that they are used as a data-pass-oriented switch block. Thus, fourteen configuration memories are saved, as compared to sixteen configuration memories required in a control-oriented switch block (in the case of FIG. 1). Since the number of the configuration memories required is fixed to two in spite of increase in number of tracks, the number of configuration memories saved with the increase in number of the tracks further increases.

When the configuration memories function as the data-pass-oriented switch block, unused configuration memories may be connected in the form of shift register to be used as a routing buffer with a first-in-first-out (FIFO) function or delay control circuits. When the unused configuration memories are used as the routing buffer with a FIFO function, they may be used as a 3-bit routing buffer for each signal in the structure in FIG. 4.

On the other hand, when the configuration memories are used as a delay circuit, all the fifteen unused configuration memories may be connected to a shift register to be used as a delay circuit.

In a typical FPGA, there are functions that can be implemented only using a 16-bit lookup table (LUT) in a logic module. In embodiments of the inventive concept, these functions may be implemented using idle configuration memories that are unused in a specific operation mode. Since a number of FIFOs or delay circuits are practically required for a data-pass-oriented circuit, the technical utilization according to the inventive concept may be high.

According to the inventive concept, a switch block used in an FPGA is configured to be a reconfigurable switch block. Thus, both a control-oriented circuit and a data-pass-oriented circuit may be efficiently switched. As a result, configuration memories unused in the data-pass-oriented circuit may be used as a routing buffer with a FIFO function or a shift-register-based delay circuit capable of adjusting delay time of a signal.

As described so far, a switch block is efficiently reconfigurable depending on the intended use. In addition, configuration memories unused in a specific operation mode can be applied to other purposes.

While the inventive concept has been described with reference to illustrative embodiments, this description is not intended to be construed in a limiting sense. It will be clearly understood by those skilled in the art that foregoing description is merely by way of example and is not a limitation on the scope of the inventive concept. Various modifications and combinations of the illustrative embodiments, as well as other embodiments of the inventive concept, will be apparent to persons skilled in the art upon reference to the description. For example, in different cases, the connection structures or the arrangements of circuits illustrated in FIGS. 4 and 5 may be modified or changed without departing from the spirit and scope of the inventive concept as defined by the following claims.

What is claimed is:

1. A switch block circuit in a field programmable gate array, comprising:
a configuration memory unit including first group memories and second group memories;
a switching unit including first group switching transistors respectively switched depending on values stored in the first group memories, and second group switching transistors respectively switched depending on values stored in the second group memories and an operation mode; and
a selection unit connected to outputs of the second group memories and to inputs of the second group switching transistors, and configured to correspondingly connect the outputs of the second group memories with the inputs of the second group switching transistors according to the operation mode,
wherein the selection unit includes second group multiplexers responding to a selection control signal applied according to the operation mode.

2. The switch block circuit as set forth in claim 1, wherein the operation mode includes a control-oriented operation mode and a data-pass-oriented operation mode.

3. The switch block circuit as set forth in claim 2, wherein the second group memories and the second group switching transistors are correspondingly connected through the second group multiplexers in the control-oriented operation mode.

4. The switch block circuit as set forth in claim 3, wherein the second group memories and the second group switching transistors are separated by the second group multiplexers in the data-pass-oriented operation mode.

5. The switch block circuit as set forth in claim 3, wherein the second group memories unused in the data-pass-oriented operation mode are used as a routing buffer with a first-in-first-out (FIFO) function.

6. The switch block circuit as set forth in claim 3, wherein the second group memories unused in the data-pass-oriented operation mode are used as a shift-register-based delay circuit.

7. The switch block circuit as set forth in claim 1, wherein the selection control signal is provided from a program memory.

8. A switch block circuit in a field programmable gate array, comprising:
a configuration memory unit including first group memories and second group memories;
a switching unit including first group switching transistors respectively switched depending on values stored in the first group memories and second group switching transistors respectively switched depending on values stored in the second group memories;
a selection unit configured to correspondingly connect the second group memories with the second group switching transistors according to an operation mode, wherein the selection unit includes second group multiplexers responding to a selection control signal applied according to the operation mode; and
first group multiplexers configured to correspondingly connect the first group memories with the first group switching transistors according to a common control determination signal.

9. The switch block circuit as set forth in claim 8, wherein a first memory in the first group memories and a first switching transistor in the first group switching transistors are directly connected without interposition of the first group multiplexers.

10. The switch block circuit as set forth in claim 9, wherein first input terminals of the first group multiplexers are commonly connected to the first memory and second input terminals thereof are correspondingly connected to the first group memories except for the first memory, respectively.

11. The switch block circuit as set forth in claim 8, wherein the common control determination signal is provided from a program memory.

12. A switch block circuit in a field programmable gate array, comprising:
a configuration memory unit including first group memories and second group memories;
a switching unit including first group switching transistors respectively switched depending on values stored in the first group memories and second group switching transistors respectively switched depending on values stored in the second group memories;
second group multiplexers configured to correspondingly connect the second group memories with the second group switching transistors according to a selection control signal; and
a program memory configured to commonly apply the selection control signal to the second group multiplexers.

13. The switch block circuit as set forth in claim 12, wherein the selection control signal is applied in a control-oriented operation mode and a data-pass-oriented operation mode.

14. The switch block circuit as set forth in claim 13, wherein the second group multiplexers correspondingly connect the second group memories with the second group switching transistors in the control-oriented operation mode.

15. The switch block circuit as set forth in claim 13, wherein the second group multiplexers make the second group memories and the second group switching transistors unconnected in the data-pass-oriented operation mode.

16. The switch block circuit as set forth in claim 12, further comprising:
first group multiplexers configured to correspondingly connect the first group memories with the first group switching transistors according to a common control determination signal.

17. The switch block circuit as set forth in claim 16, wherein the second group memories unused in the data-pass-oriented operation mode are used as a lookup table.

18. The switch block circuit as set forth in claim 16, wherein the second group memories unused in the data-pass-oriented operation mode are used as a data delay circuit.

* * * * *